United States Patent
Ueda et al.

(10) Patent No.: US 11,864,312 B2
(45) Date of Patent: Jan. 2, 2024

(54) PRINTED CIRCUIT BOARD AND METHOD OF MANUFACTURING PRINTED CIRCUIT BOARD

(71) Applicant: SUMITOMO ELECTRIC INDUSTRIES, LTD., Osaka (JP)

(72) Inventors: Hiroshi Ueda, Osaka (JP); Ippei Tanaka, Osaka (JP); Takashi Kasuga, Osaka (JP); Masamichi Yamamoto, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 110 days.

(21) Appl. No.: 17/593,573

(22) PCT Filed: Feb. 27, 2020

(86) PCT No.: PCT/JP2020/008179
§ 371 (c)(1),
(2) Date: Sep. 21, 2021

(87) PCT Pub. No.: WO2020/195526
PCT Pub. Date: Oct. 1, 2020

(65) Prior Publication Data
US 2022/0167498 A1 May 26, 2022

(30) Foreign Application Priority Data
Mar. 28, 2019 (JP) ................................. 2019-063746

(51) Int. Cl.
*H05K 1/02* (2006.01)
*H05K 3/18* (2006.01)

(52) U.S. Cl.
CPC ............. *H05K 1/0296* (2013.01); *H05K 3/18* (2013.01); *H05K 2201/09227* (2013.01); *H05K 2203/0723* (2013.01)

(58) Field of Classification Search
CPC ............ H05K 1/02; H05K 2203/0723; H05K 2201/09227; H05K 3/18; H05K 1/0296
(Continued)

(56) References Cited

U.S. PATENT DOCUMENTS

2009/0202949 A1  8/2009  Takemura
2013/0161077 A1  6/2013  Watanabe
(Continued)

FOREIGN PATENT DOCUMENTS

JP  H9-136378    5/1997
JP  2000-208881  7/2000
(Continued)

*Primary Examiner* — Tremesha S Willis
(74) *Attorney, Agent, or Firm* — IPUSA, PLLC

(57) ABSTRACT

According to one aspect of the present disclosure, a printed circuit board includes: an insulating base film; and a plurality of wiring portions formed on a surface of the base film, wherein the wiring portions include a seed layer that is directly or indirectly layered on the surface of the base film and a metal layer that is layered on the seed layer, wherein the base film has a wiring area including the plurality of wiring portions and a non-wiring area not including the wiring portions, wherein the plurality of wiring portions include at least one outermost boundary wiring portion and a plurality of inner wiring portions other than the outermost boundary wiring portion, wherein the outermost boundary wiring portion is formed on an outermost side of the base film in the wiring area and at a boundary between the wiring area and the non-wiring area, wherein an average width of the outermost boundary wiring portion is 30 μm or more, wherein an average width of the inner wiring portions is 20 μm or less, and wherein an average aspect ratio of the inner wiring portions is 1.5 or more.

4 Claims, 3 Drawing Sheets

(58) Field of Classification Search
USPC .......................................................... 174/250
See application file for complete search history.

(56) References Cited

U.S. PATENT DOCUMENTS

2014/0055328 A1   2/2014  Osako
2020/0185445 A1*  6/2020  Yamagishi ........ H01L 27/14645

FOREIGN PATENT DOCUMENTS

| JP | 2004-006773 | 1/2004 |
| JP | 2006-269615 | 10/2006 |
| JP | 2009-218561 | 9/2009 |
| JP | 2012-049462 | 3/2012 |
| WO | 2013/051236 | 4/2013 |

* cited by examiner

SAMPLE No.1
SHOWER PRESSURE
0.3 MPa

SAMPLE No.1
SHOWER PRESSURE
0.5 MPa

PRINTED CIRCUIT BOARD AND METHOD OF MANUFACTURING PRINTED CIRCUIT BOARD

TECHNICAL FIELD

The present disclosure relates to a printed circuit board and a method of manufacturing a printed circuit board.

The present application is based on and claims priority to Japanese Patent Application No. 2019-063746, filed on Mar. 28, 2019, the entire contents of the Japanese Patent Application are hereby incorporated herein by reference.

BACKGROUND ART

Along with the reduction in size and weight of electronic devices, the pitch of wiring portions of a printed circuit board is tried to be made finer. A semi-additive process is adopted as a method of making wiring portions of a printed circuit board with a high-density fine pitch. In this semi-additive process, for example, a seed layer is famed on the surface of an insulating resin layer, a portion other than the portion forming a circuit is coated with a plating resist, and then a metal layer is selectively formed only on the circuit portion by electroplating. Further, the plating resist is peeled off and the seed layer other than the circuit portion is etched to form a printed circuit board (Japanese Laid-open Patent Publication No. 2004-6773).

PRIOR ART DOCUMENTS

Patent Documents

[Patent Document 1] Japanese Laid-open Patent Publication No. 2004-6773

SUMMARY OF THE INVENTION

According to one aspect of the present disclosure, a printed circuit board includes: an insulating base film; and a plurality of wiring portions formed on a surface of the base film, wherein the wiring portions include a seed layer that is directly or indirectly layered on the surface of the base film and a metal layer that is layered on the seed layer, wherein the base film has a wiring area including the plurality of wiring portions and a non-wiring area not including the wiring portions, wherein the plurality of wiring portions include at least one outermost boundary wiring portion and a plurality of inner wiring portions other than the outermost boundary wiring portion, wherein the outermost boundary wiring portion is formed on an outermost side of the base film in the wiring area and at a boundary between the wiring area and the non-wiring area, wherein an average width of the outermost boundary wiring portion is 30 µm or more, wherein an average width of the inner wiring portions is 20 µm or less, and wherein an average aspect ratio of the inner wiring portions is 1.5 or more.

According to another one aspect of the present disclosure, a method of manufacturing a printed circuit board in which a conductive pattern including a plurality of wiring portions is formed directly or indirectly on a surface of an insulating base film by a semi-additive process is a method of manufacturing a printed circuit board including: a seed layer layering step of directly or indirectly layering a conductive seed layer on the surface of the base film; a resist pattern forming step of foaming a resist pattern having an inverted shape of the plurality of wiring portions on a surface of the seed layer; a metal layer layering step of layering a metal layer by electroplating on the surface of the seed layer exposed from the resist pattern; a resist pattern peeling step of peeling off the resist pattern; and a seed layer peeling step of peeling off the seed layer exposed after the resist pattern peeling step; wherein the base film has a wiring area including the plurality of wiring portions and a non-wiring area not including the wiring portions, wherein the plurality of wiring portions include at least one outermost boundary wiring portion and a plurality of inner wiring portions other than the outermost boundary wiring portion, wherein the outermost boundary wiring portion is formed on an outermost side of the base film in the wiring area and at a boundary between the wiring area and the non-wiring area, wherein an average width of the outermost boundary wiring portion is 30 µm or more, wherein an average width of the inner wiring portions is 20 µm or less, and wherein an average aspect ratio of the inner wiring portions is 1.5 or more.

EMBODIMENT FOR CARRYING OUT THE INVENTION

Figure 1:
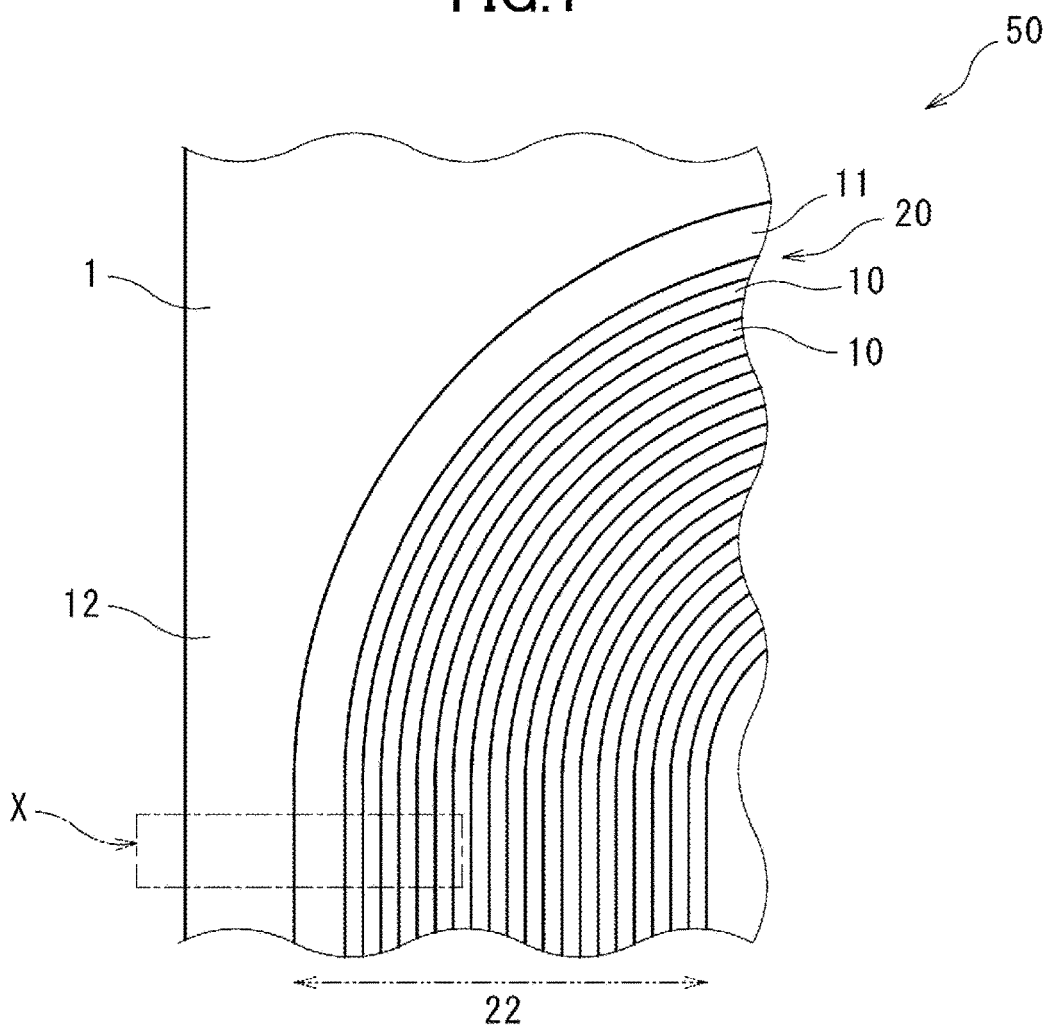
FIG. 1 is a schematic partial plan view illustrating a printed circuit board according to one embodiment.

Problem to be Solved by the Present Disclosure

In the step of forming a circuit as described above, pressure due to a shower of an etching solution during a peeling step and a physical force due to the contact of a ring roller or the like at the time of transportation are applied to wiring portions. Because the installation area of the wiring portions is small, a fine pitch circuit that is formed by a semi-additive process is vulnerable to a force from the lateral side. In particular, peeling of the wiring portion provided at the boundary between the area without wiring portions and the area where the wiring portions are dense is likely to occur. Further, this effect is more prominent in wiring portions with a high average aspect ratio.

In this manner, in a case in which a wiring portion is peeled off in the circuit forming step, there is a risk that a short circuit may occur due to contact with the adjacent wiring portion or disconnection may occur due to a part of the installation surface being peeled off and the floated wiring portion being torn off. In addition, because the peeled and dropped wiring portion becomes a foreign substance having electrical conductivity, there is a risk that other printed circuit boards may be contaminated, resulting in mounting failure or malfunction at other parts.

In view of the above, the present disclosure has an object to provide a printed circuit board and a method of manufacturing a printed circuit board that enable to suppress peeling of a wiring portion that is provided at the boundary between a wiring area where wiring portions are formed and a non-wiring area without wiring portions in a case of having wiring portions with a high average aspect ratio.

Effect of the Present Disclosure

In a case of having wiring portions with a high average aspect ratio, a printed circuit board according to the present disclosure enables to suppress peeling of a wiring portion that is provided at the boundary between a wiring area where wiring portions are formed and a non-wiring area. Also, by a method of manufacturing a printed circuit board according to the present disclosure, in a case of having wiring portions with a high average aspect ratio, it is possible to manufacture a printed circuit board that enables to suppress peeling of a wiring portion that is provided at the boundary between a wiring area where wiring portions are formed and a non-wiring area.

Description Embodiment of the Present Disclosure

An embodiment of the present disclosure will first be described by listing.

According to one aspect of the present disclosure, a printed circuit board includes: an insulating base film; and a plurality of wiring portions formed on a surface of the base film, wherein the wiring portions include a seed layer that is directly or indirectly layered on the surface of the base film and a metal layer that is layered on the seed layer, wherein the base film has a wiring area including the plurality of wiring portions and a non-wiring area not including the wiring portions, wherein the plurality of wiring portions include at least one outermost boundary wiring portion and a plurality of inner wiring portions other than the outermost boundary wiring portion, wherein the outermost boundary wiring portion is formed on an outermost side of the base film in the wiring area and at a boundary between the wiring area and the non-wiring area, wherein an average width of the outermost boundary wiring portion is 30 μm or more, wherein an average width of the inner wiring portions is 20 μm or less, and wherein an average aspect ratio of the inner wiring portions is 1.5 or more.

The inventors of the present invention have found that in a case in which the average aspect ratio of the wiring portions in a fine pitch circuit having an average width of 20 μm or less is designed to be high, specifically, in a case in which the average aspect ratio is 1.5 or more, an occurrence of peeling of a wiring portion, which is located at the outermost side of the base film and which is provided at the boundary tween the wiring area where the wiring portions are formed and the non-wiring area where the wiring portions are not present, becomes prominent due to pressure by a shower of an etching solution during a peeling step and a physical force by the contact of a ring roller or the like at the time of transportation. According to the printed circuit board, because the outermost boundary wiring portion, which is formed on the outermost side of the base film in the wiring area and at the boundary between the wiring area and the non-wiring area, has an average width of 30 μm or more, sufficient adhesion to the base film can be exhibited. As a result, peeling of the outermost boundary wiring portion during the circuit forming step can be suppressed.

Conventionally, in order to suppress the peeling of the outermost boundary wiring portion, after a circuit is formed, the circuit is covered with a cover coat. However, in the circuit forming step performed before covering with the cover coat, is exposed to physical force such as the shower of an etchant, and therefore it is difficult to sufficiently suppress the peeling of the outermost boundary wiring portion by the means of covering with the cover coat. On the other hand, according to the printed circuit board, even in the step of covering with the cover coat, it is possible to obtain the suppression effect with respect to peeling of the outermost boundary wiring portion.

Further, in the case of a fine pitch circuit, the base film tends to bend easily, and wrinkles tend to occur. However, when the average width of the outermost boundary wiring is 30 μm or more, the occurrence of wrinkles can be reduced.

The average width of the outermost boundary wiring portion is preferably 50 μm or more. In this manner, when the average width of the outermost boundary wiring portion is 50 μm or more, the suppression effect with respect to the peeling of the outermost boundary wiring portion can be further enhanced.

According to another one aspect of the present disclosure, a method of manufacturing a printed circuit board in which a conductive pattern including a plurality of wiring portions is formed directly or indirectly on a surface of an insulating base film by a semi-additive process is a method of manufacturing a printed circuit board including: a seed layer layering step of directly or indirectly layering a conductive seed layer on the surface of the base film; a resist pattern forming step of forming a resist pattern having an inverted shape of the plurality of wiring portions on a surface of the seed layer; a metal layer layering step of layering a metal layer by electroplating on the surface of the seed layer exposed from the resist pattern; a resist pattern peeling step of peeling off the resist pattern; and a seed layer peeling step of peeling off the seed layer exposed after the resist pattern peeling step; wherein the base film has a wiring area including the plurality of wiring portions and a non-wiring area not including the wiring portions, wherein the plurality of wiring portions include at least one outermost boundary wiring portion and a plurality of inner wiring portions other than the outermost boundary wiring portion, wherein the outermost boundary wiring portion is formed on an outermost side of the base film in the wiring area and at a boundary between the wiring area and the non-wiring area, wherein an average width of the outermost boundary wiring portion is 30 μm or more, wherein an average width of the inner wiring portions is 20 μm or less, and wherein an average aspect ratio of the inner wiring portions is 1.5 or more.

The printed circuit board that is manufactured by the method of manufacturing the printed circuit board includes the outermost boundary wiring portion formed on the outermost side of the base film in the wiring area including the plurality of wiring portions and at the boundary between the wiring area and the non-wiring area. Then, because the average width of the outermost boundary wiring portion is 30 μm or more, the average width of the inner wiring portions is 20 μm or less, and the average aspect ratio of the inner wiring portions is 1.5 or more, in a case of having wiring portions with a high average aspect ratio, it is possible to obtain a printed circuit board that enables to suppress peeling of the outermost boundary wiring portion.

In the method of manufacturing the printed circuit board, it is preferable to form the resist pattern by using a dry film photoresist in the resist pattern forming step of forming the resist pattern. By using the dry film photoresist in the resist pattern forming step of forming the resist pattern, the thickness of the resist layer can be suitably selected over a wide range, and the operability is excellent.

It should be noted that, in the present disclosure, the "average width" of the wiring portion means the average value obtained by measuring the maximum width in a cross section perpendicular to the longitudinal direction of the wiring portion at any five points in the longitudinal direction of the wiring portion. The "average aspect ratio" of the wiring portion means the average value obtained by measuring the aspect ratio in a cross section perpendicular to the longitudinal direction of the wiring portion at any five points the longitudinal direction of the wiring portion. Also, the "aspect ratio" is expressed as A/B when the maximum length in the thickness direction in the cross section perpendicular to the longitudinal direction of the wiring portion is A and the average width is B. The "average thickness" means the average value of the thickness measured at any five points.

Details of Embodiment of the Present Disclosure

In the following, a printed circuit board and a method of manufacturing a printed circuit board according to an embodiment of the present disclosure will be described in detail with reference to the drawings.

<Printed Circuit Board>

Figure 2:
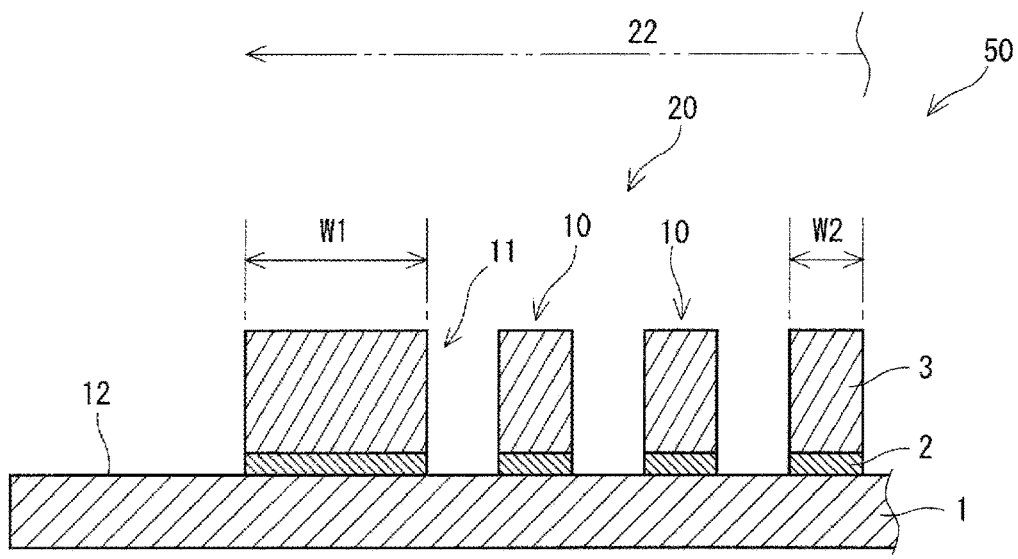
FIG. 2 is a schematic partial cross-sectional view illustrating the printed circuit board according to one embodiment.

FIG. 1 is a schematic partial plan view illustrating a printed circuit board 50 according to an embodiment, and FIG. 2 is a schematic partial cross-sectional view in an X area of the printed circuit board 50 of FIG. 1. As illustrated in FIG. 1, the printed circuit board 50 includes a conductive pattern including a plurality of wiring portions having a U-shaped folding area in a plan view. The plurality of wiring portions are arranged at approximately equal intervals without short-circuiting wires. The plurality of wiring portions are composed of an outermost boundary wiring portion 11 that is located at the outermost side of the base film 1 and that is provided at the boundary between a wiring area 22 where the wiring portions are formed and a non-wiring area 12 where the wiring portions are not present, and inner wiring portions 10 that are a plurality of wiring portions other than the outermost boundary wiring portion 11. More specifically, the wiring area 22 is an area in which the base film 1 includes a plurality of wiring portions. Also, the plurality of wiring portions include one outermost boundary wiring portion 11 and a plurality of inner wiring portions 10 other than the outermost boundary wiring portion 11. On the other hand, the non-wiring area 12 is an area where there is no outermost boundary wiring portion of the outermost boundary wiring portion 11 located on the outermost side of the wiring area 22 in the base film 1. Then, the outermost boundary wiring portion 11 is formed on the outermost side of the base film 1 in the wiring area 22 and at the boundary between the wiring area 22 and the non-wiring area 12. Also, as illustrated in FIG. 2, the printed circuit board 50 includes a conductive seed layer 2 that is directly or indirectly layered on the surface of the base film 1 and a conductive pattern 20 that is directly or indirectly layered on the surface of the seed layer 2 and includes a plurality of wiring portions. The outermost boundary wiring portion 11 and the inner wiring portions 10 have the seed layer 2 and the metal layer 3 that is layered on the seed layer 2.

[Base Film]

The base film 1 contains a synthetic resin as a main component and is electrically insulating. The base film 1 is a base film for forming a conductive pattern. The base film 1 may have flexibility. In a case in which the base film 1 has flexibility, the printed circuit board 50 can be used as a flexible printed circuit board.

Examples of the synthetic resin include polyimide, polyethylene terephthalate, liquid crystal polymer, fluororesin, and the like.

In a case in which the printed circuit board 50 is used as a flexible printed circuit board, the lower limit of the average thickness of the base film 1 is preferably 5 µm and is more preferably 10 µm. On the other hand, the upper limit of the average thickness of the base film 1 is preferably 50 µm and is more preferably 40 µm. When the average thickness of the base film 1 is less than the above lower limit, the dielectric strength of the base film 1 may become insufficient. On the other hand, when the average thickness of the base film 1 exceeds an upper limit as described above, the printed circuit board may become unnecessarily thick or the flexibility may become insufficient.

[Seed Layer]

The seed layer 2 is a metal layer for plating formation for applying electroplating to one surface side of the base film 1. Also, the seed layer 2 may be a sintered layer of metal particles obtained by applying an ink containing metal particles to one surface of the base film 1 and sintering the metal particles. Examples of the main component of the seed layer 2 include nickel, gold, silver, tungsten, molybdenum, copper, tin, cobalt, chromium, iron, zinc, and the like. Among them, copper, which has high adhesion to the base film 1 and is suitable as a plating starting surface, is preferable. The average thickness of the seed layer 2 can be, for example, about 10 nm or more and 2 µm or less from the viewpoint of enhancing the removal efficiency by etching while preventing the occurrence of cuts in the plane direction.

[Metal Layer]

The metal layer 3 is formed by electroplating. Examples of the main component of the metal layer 3 include copper, nickel, silver, and the like. Among them, copper is preferable because it has high conductivity, is relatively inexpensive, and can provide high adhesion to the seed layer 2 in a case in which the main component of the seed layer 2 is copper. In a case in which the main component of the metal layer 3 is copper, the metal layer 3 is preferably formed by electroplating using a copper sulfate plating bath containing an additive, from the viewpoint that cost is relatively inexpensive and the thickness is easily adjusted.

The average thickness of the metal layer 3 is set depending on the configuration of a printed circuit to be manufactured, is not particularly limited, and may be 1 µm or more and 10 µm or less, for example.

[Conduction Pattern]

The plurality of wiring portions constituting the conductive pattern 20 are composed of the outermost boundary wiring portion 11 that is located at the outermost side of the plurality of wiring portions on the base film 1 and that provided at the boundary between the wiring area where the wiring portions are formed and the non-wring area 12 without the wiring portions and a plurality of inner wiring portions 10 other than the outermost boundary wiring portion 11. The plurality of inner wiring portions 10 are formed linearly in a substantially same shape. Each of the plurality of inner wiring portions 10 is small in width and disposed at a narrow pitch. In other words, the plurality of inner portions 10 are disposed at fine pitch.

The lower limit of the average width 1 of the outermost boundary wiring portion 11 is 30 µm, and may be more preferably 50 µm. On the other hand, the upper limit of the average width W1 of the outermost boundary wiring portion 11 is not particularly limited, and may be, for example, 200 µm. When the average width W1 is less than a lower limit as described above, it may be difficult to sufficiently suppress the peeling of the outermost boundary wiring portion 11 during the circuit forming step.

The upper limit of the average aspect ratio of the outermost boundary wiring portion 11 is preferably 1.5. When the upper limit of the average aspect ratio of the outermost boundary wiring portion 11 is within the above range, peeling of the circuit can be suppressed. On the other hand, the lower limit of the average aspect ratio is not particularly limited, but may be, for example, 0.3.

The lower limit of the average width W2 of the inner wiring portions 10, which are wiring portions other than the outermost boundary wiring portion 11, is 2 µm and may be more preferably 5 µm. On the other hand, the upper limit of the average width W2 of the inner wiring portions 10 is 20 µm and may be preferably 18 µm. When the average width W2 is less than a lower limit as described above, the inner wiring portions 10 may not be easily manufactured. On the other hand, if the average width W2 exceeds an upper limit as described above, it may be difficult to obtain a desired wiring density.

The lower limit of the average aspect ratio of the inner wiring portions 10, which are wiring portions other than the outermost boundary wiring portion 11, is 1.5 and may be preferably 1.7. As described above, because the installation area of the wiring portions is small, a fine pitch circuit that is formed by a semi-additive process is vulnerable to a force from the lateral side. In particular, of the wiring portion provided at the boundary between the area without wiring portions and the area where the wiring portions are dense is likely to occur. Further, this effect becomes more remarkable in wiring portions having a high average aspect ratio. Therefore, the present embodiment is more effective in a case in which the average aspect ratio is 1.5 or more. On the other hand, the upper limit of the average aspect ratio of the inner wiring portions 10 other than the outermost boundary wiring portion 11 is preferably 10 and is more preferably 8. When the average aspect ratio of the inner wiring portions 10 exceeds an upper limit as described above, the installation area of the inner wiring portions 10 becomes excessively small, and the inner wiring portions 10 may be easily peeled off.

The lower limit of the average interval D of the plurality of inner wiring portions 10 is preferably 2 µm and is more preferably 5 µm. On the other hand, the upper limit of the average interval D of the plurality of inner wiring portions 10 is preferably 30 µm and is more preferably 25 µm. When the average interval D is less than a lower limit as described above, the plurality of inner wiring portions 10 may not be easily manufactured. On the other hand, when the average interval D exceeds an upper limit as described above, it may be difficult to obtain a desired wiring density. Here, the "average interval D of the plurality of inner wiring portions 10" refers to the average distance between the end surfaces of inner wiring portions 10 and the end surfaces of the inner wiring portions 10 adjacent thereto.

The lower limit of the ratio (W2/D) of the average width W2 of the inner wiring portions 10 to the average interval D of the plurality of inner wiring portions 10 is preferably 0.3 and is more preferably 0.5. On the other hand, the upper limit of W2/D is preferably 10.0 and is more preferably 5.0. When W2/D is less than a lower limit as described above, the average interval D of the plurality of inner wiring portions 10 becomes unnecessarily large, and it may be difficult to obtain a desired wiring density. Further, the average width W2 of the inner wiring portions 10 becomes smaller, and wiring portions may be easily peeled off. On the other hand, when W2/D exceeds an upper limit as described above, the average width W2 of the inner wiring portions 10 becomes unnecessarily large, and it may be become difficult to obtain a desired wiring density.

According to the printed circuit board 50, even in a case in which the average aspect ratio of the plurality of inner wiring portions 10 is high, peeling of the outermost boundary wiring portion 11, which is formed on the outermost side of the base film 1 in the wiring area 22 and at the boundary between the wiring area 22 and the non-wiring area 12, can be suppressed.

<Method of Manufacturing of Printed Circuit Board>

Next, an example of a manufacturing method of the printed circuit board 50 of FIG. 1 will be described with reference to FIG. 2 to FIG. 6.

The method of manufacturing the printed circuit board is a method of manufacturing a printed circuit board in which a conductive pattern including a plurality of wiring portions is formed directly or indirectly on a surface of an insulating base film by a semi-additive process.

Specifically, the method of manufacturing the printed circuit board includes: a step (seed layer layering step) of layering a seed layer; a resist pattern forming step (resist pattern forming step) of forming a resist pattern; a metal layer layering step (metal layer layering step) of layering a metal layer by electroplating; a resist pattern peeling step (resist pattern peeling step) of peeling off the resist pattern and; a seed layer peeling step (seed layer peeling step) of peeling off the seed layer.

[Seed Layer Layering Step]

In the seed layer layering step, the conductive seed layer 2 is directly or indirectly layered on the surface of the base film 1. In the seed layer layering step, for example, the seed layer 2 is formed on almost the entire surface of the base film 1 by electroless plating, application and sintering of a fine metal particle dispersion liquid, and the like, as illustrated in FIG. 3.

(Seed Layer)

Figure 3:
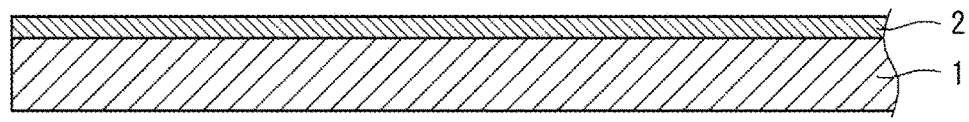
FIG. 3 is a schematic diagram illustrating a state after a seed layer layering step of a method of manufacturing a circuit board according to one embodiment.

As illustrated in FIG. 3, in the seed layer layering step, the seed layer 2 is layered for plating formation for applying electroplating to substantially the entire surface of one surface of the base film 1. The method of layering the seed layer 2 in the seed layer layering step is not particularly limited, and may be, for example, a vapor deposition method, a sputtering method, or the like. Also, as described above, in the seed layer layering step, by applying an ink containing metal particles to substantially the entire surface of one surface of the base film 1 and sintering the metal particles, a sintered layer of the metal particles may be layered on the one surface of the base film 1.

Also, prior to the seed layer layering step, a thin adhesive layer having a high adhesion to the base film and the seed layer 2 may be layered on the surface of the base film 1. Examples of the layering method of the adhesive layer include electroless plating, sputtering, vapor deposition, coupling agent coating, and the like. Among them, sputtering, which can form an adhesive layer having an excellent adhesive property, is preferable.

As the material of the adhesive layer, a metal having nickel as the main component, in particular, a nickel-chromium alloy having a high adhesive force is preferable.

[Resist Pattern Forming Step]

Figure 4:
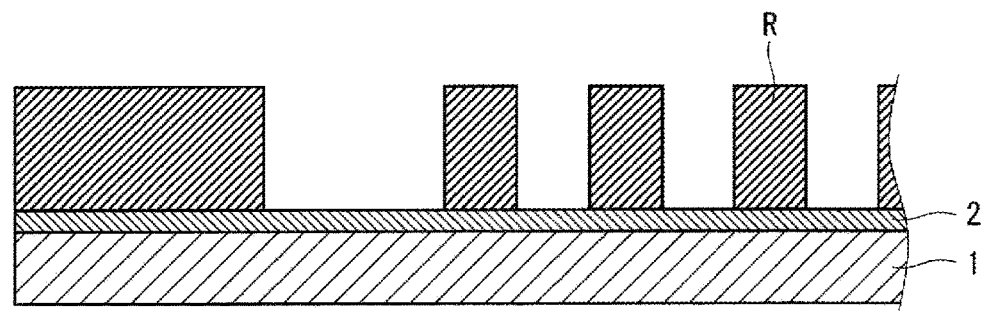
FIG. 4 is a schematic diagram illustrating a state after a resist pattern forming step of the method of manufacturing the printed circuit board according to one embodiment.

In the resist pattern forming step, a resist pattern R having an inverted shape of the plurality of inner wiring portions 10 is formed on the surface of the seed layer layered in the seed layer layering step. In the resist pattern forming step, a resist film layered on the surface of the seed layer 2, and the resist pattern R is formed by photolithography technique as illustrated in FIG. 4.

As a method of layering the resist film, for example, it is formed on the surface of the seed layer 2 by applying and drying a liquid resist composition, or by thermocompression bonding of a dry film photoresist having no fluidity at room temperature. In the resist pattern forming step of forming the resist pattern, it is preferable to form the resist pattern using the dry film photoresist. By using the dry film photoresist in the resist pattern forming step of forming the resist pattern, the thickness of the resist layer can be suitably selected over a wide range, and the operability is excellent.

In the resist pattern forming step, first, a photoresist film is layered on substantially the entire surface of the seed layer layered in the seed layer layering step. The photoresist film is formed, for example, by a positive resist composition in which a polymer bond is weakened by photosensitization and the solubility in a developing solution is increased.

Next, in the resist pattern forming step, the photoresist film is selectively exposed using a photomask or the like to form a portion to be dissolved in the developing solution and a portion not to be dissolved in the developing solution on the photoresist film. Then, the portion to be dissolved is washed away using the developing solution to form a resist pattern R having openings corresponding to the formation area of the outermost boundary wiring portion and the plurality of inner wiring portions as illustrated in FIG. 4.

Among the openings of the resist pattern R, the openings corresponding to the respective wiring portions are adjusted so that the outermost boundary wiring portion has an average width of 30 μm or more and the inner wiring portions 10 have an average width of 20 μm or less and an average aspect ratio of 1.5 or more, as described above. When the average width of the outermost boundary wiring portion and the average width and the average aspect ratio of the inner wiring portions 10 are within the ranges described above, it is possible to obtain a printed circuit board that enables to suppress peeling of the outermost boundary wiring portion in a case of having wiring portions with a high average aspect ratio.

[Metal Layer Layering Step]

Figure 5:
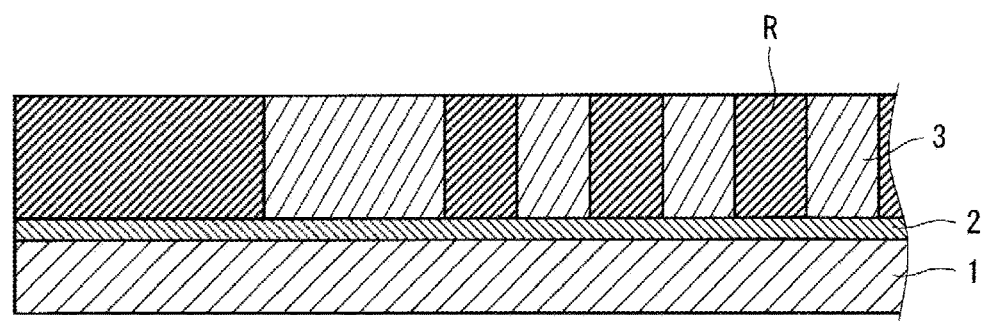
FIG. 5 is a schematic diagram illustrating a state after a metal layer layering step of the method of manufacturing the printed circuit board according to one embodiment.
Figure 6:
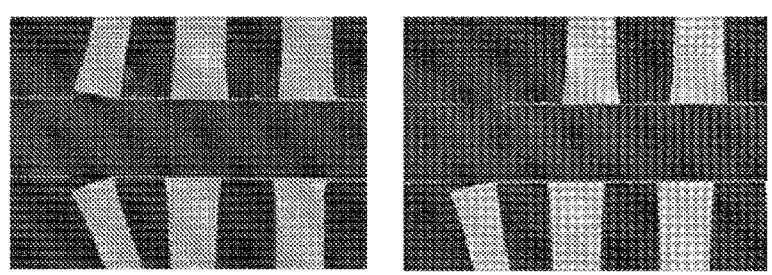
FIG. 6 is a micrograph illustrating the appearance of an outermost boundary wiring in Example.

In the metal layer layering step, the metal layer 3 is layered by electroplating on the surface of the seed layer exposed from the resist pattern formed in the resist pattern forming step. In the metal layer layering step, as illustrated in FIG. 5, the metal layer 3 is layered on the surface of the seed layer 2. In the metal layer layering step, the metal layer 3 is layered on a non-layered area (an area corresponding to openings of the resist pattern R) of the surface of the seed layer 2.

A metal that is used in the metal layer layering step may be copper, nickel, silver, or the like. Of these, copper, which is highly conductive and relatively inexpensive, is preferred. Further, in a case in which the main component of the seed layer 2 is copper, copper that enables to obtain a high adhesion to the seed layer 2 may be preferably used. In a case in which the metal used in the present step is copper, the method of layering the metal layer is not particularly limited, but it is preferable that electroplating be performed using a copper sulfate plating bath containing an additive from the viewpoint that cost is relatively inexpensive and the thickness of the metal layer 3 is easily adjusted.

[Resist Pattern. Peeling Step]

In the resist pattern peeling step, the resist pattern R formed by the resist pattern forming step is peeled off. In the resist pattern peeling step, the resist pattern R is removed by first peeling the resist pattern B from the seed layer 2. Specifically, the layered structure having the base film 1, the seed layer 2, the metal layer 3, and the resist pattern R after the metal layer layering step is immersed in a peeling solution to expand the resist pattern R by the peeling solution. Thereby, a repulsive force is generated between the resist pattern R and the seed layer 2, and the resist pattern R is peeled off from the seed layer 2. A known solution can be used as the peeling solution.

[Seed Layer Peeling Step]

In the seed layer peeling step, the seed layer exposed after the resist pattern peeling step is peeled off. For the etching, an etching solution that erodes the metal forming the seed layer 2 is used. In this manner, by removing the resist pattern and the area of the seed layer 2 overlapping the resist pattern R in plan view, the plurality of inner wiring portions 10 and the outermost boundary wiring portions 11 are manufactured. The conductive pattern 20 after the resist pattern peeling step and the seed layer peeling step is as illustrated in FIG. 2.

As described above, in the printed circuit board 50 that is manufactured by the method of manufacturing the printed circuit board, the base film 1 includes the wiring area 22 including the plurality of wiring portions and a non-wiring area 12 not including the wiring portions. The outermost boundary wiring portion 11 is formed on the outermost side of the base film 1 in the wiring area 22 and at the boundary between the wiring area 22 and the non-wiring area 12. Then, the average width of the outermost boundary wiring portion 11 is 30 μm or more. Also, the average width of the inner wiring portions 10 other than the outermost boundary wiring portion 11 is 20 μm or less. The average aspect ratio of the inner wiring portions 10 is 1.5 or more. Therefore, according to the method of manufacturing the printed circuit board, even in a case in which the average aspect ratio of the plurality of inner wiring portions 10 is high, it is possible to suppress peeling of the outermost boundary wiring portion that provided at the boundary between the wiring area 22, where the inner wiring portions 10 are formed, and the non-wiring area 12 without the wiring portions.

Other Embodiments

The embodiment disclosed herein above should be considered exemplary in all respects and not limiting. The scope of the present disclosure is not limited to configurations of the above described embodiment, but is indicated by claims and is intended to include all changes within the meaning and scope of equivalence with the claims.

Although the above-described embodiment describes a configuration in which a conductive pattern is layered on one surface side of a base film, the printed circuit board may have a configuration in which a pair of conductive patterns are layered on both surface sides of the base film. Also, the method of manufacturing the printed circuit board may form a pair of conductive patterns on both surface sides of the base film.

Figure 7:
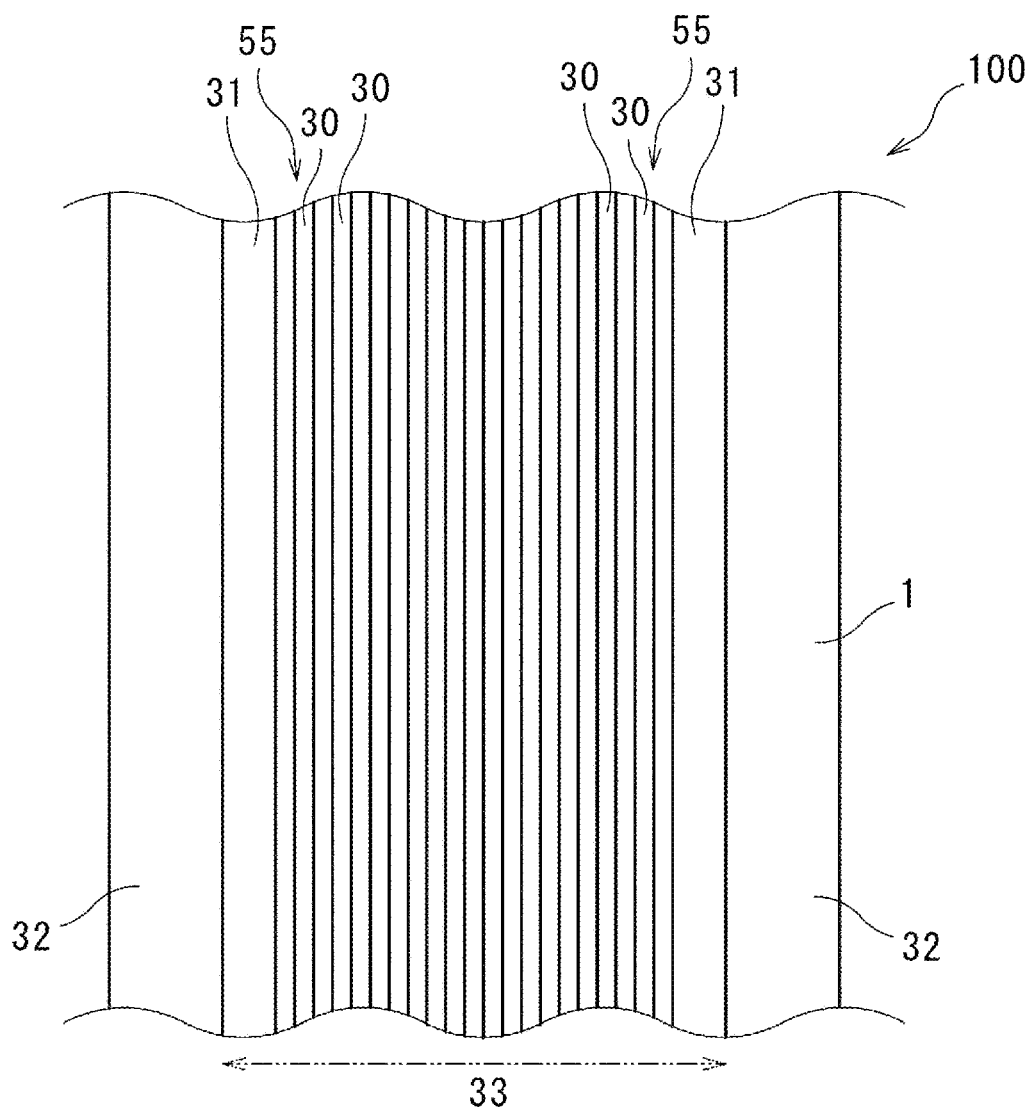
FIG. 7 is a schematic partial plan view illustrating a printed circuit board according to another embodiment.

In the above-described embodiment, a configuration in which a U-shaped conductive pattern is layered in a plan view has been described. However, the shape of the conductive pattern is not particularly limited, and various shapes, such as a straight shape and a spiral shape, can be employed. For example, as illustrated in FIG. 7, a specific example of another conductive pattern may be a configuration in which a conductive pattern does not have a folded structure, is linear, and is arranged substantially parallel at approximately equal intervals. A printed circuit board 100 illustrated in FIG. 7 includes a base film 1 and a conductive pattern 55 including a plurality of wiring portions formed on the surface of the base film 1. The plurality of wring portions are arranged at approximately equal intervals without short-circuiting the wiring. The base film 1 has a wiring area 33 including the plurality of wiring portions and non-wiring areas 32 not including the wiring portions. The plurality of wiring portions described above include two outermost boundary wiring portions 31 and a plurality of inner wiring portions 30 other than outermost boundary wiring portions 3. The outermost boundary wiring portions 31 are formed on the outermost sides of the base film 1 in the wiring area 33 and at the boundaries between the wiring area 33 and the non-wiring areas 32.

layer layering step). Next, a photoresist film is layered on the substantially entire surface of the seed layer by thermocompression bonding of an acrylic-based dry film resist. Thereafter, the photoresist film is selectively exposed using a photomask to form a portion to be dissolved in a developing solution and a portion not to be dissolved in the developing solution on the photoresist film. Then, the portion to be dissolved is washed away using the developing solution to form a resist pattern having openings corresponding to the formation area of the plurality of wiring portions (resist pattern forming step).

Next, by applying electrocopper plating to the surface or the seed layer after the resist pattern forming step with a copper sulfate plating bath at 25° C. containing 100 g/L of copper sulfate pentahydrate, a metal layer with an average thickness of 10 μm was layered (metal layer layering step).

Next, after the metal layer layering step, the resist pattern was removed using a dry film peeling solution (resist pattern peeling step), and printed circuit boards No. 1 to No. 5 were manufactured. Table 1 indicates the average widths and the average aspect ratios of the plurality of wiring portions of the printed circuit boards No. 1 to No. 5.

TABLE 1

| | SAMPLE No. | | | No. 1 | No. 2 | No. 3 | No. 4 | No. 5 (REFERENCE EXAMPLE) |
|---|---|---|---|---|---|---|---|---|
| BOUNDARY WIRING PORTION | AVERAGE WIDTH W1 [μm] | | | 20 | 25 | 30 | 53 | 20 |
| | AVERAGE ASPECT RATIO | | | 2.0 | 1.6 | 1.3 | 0.8 | 1.0 |
| INNER WIRING PORTIONS | AVERAGE WIDTH W2 [μm] | | | 18 | 18 | 18 | 18 | 18 |
| | AVERAGE ASPECT RATIO | | | 2.2 | 2.2 | 2.2 | 2.2 | 1.1 |
| AVERAGE INTERVAL OF WIRING PORTIONS [μm] | | | | 16 | 16 | 16 | 16 | 16 |
| APPEARANCE EVALUATION | SHOWER PRESSURE | 0.1 MPa | VISUAL DETERMINATION | A | A | A | A | A |
| | | 0.3 MPa | VISUAL DETERMINATION | B | B | A | A | A |
| | | 0.5 MPa | VISUAL DETERMINATION | C | C | A | A | A |

The average width of the outermost boundary wiring portions 31 is 30 μm or more. Also, the average width of the inner wiring portions 30 is 20 μm or less, and the average aspect ratio of the inner wiring portions 30 is 1.5 or more. Therefore, even by the printed circuit board 100, even in a case in which the average aspect ratio of the plurality of inner wiring portions 30 is high, peeling of the outermost boundary wiring portions 31 can be suppressed.

EXAMPLES

Although the present disclosure will be described below in detail with reference to Examples, the present disclosure is not limited to the Examples.

[No. 1 to No. 5]

A base film made of a polyimide film with an average thickness of 25 μm was prepared. A conductive pattern including ten wiring portions arranged in parallel was formed on both surface sides of the base film by a semi-additive process. Specifically, a seed layer made of copper with an average thickness of 0.4 μm was first layered (seed

[Evaluation]

(Determination Peeling by Appearance Evaluation)

For each of the printed circuit boards No. 1 to No. 5, the above-described resist pattern peeling step was conducted with a shower of dry film peeling solution under the conditions of three shower pressures of 0.1 MPa, 0.3 MPa, and 0.5 MPa, and the respective states of the outermost boundary wiring portion were determined visually by a microscope. Specifically, the condition of peeling of the outermost boundary wiring portion was evaluated by the following three levels A to C. The evaluation results are indicated in Table 1. Also, FIG. 6 indicates electron micrographs illustrating the appearance of the outermost boundary wiring portion of the printed circuit board No. 1 evaluated as B when the resist pattern peeling step was conducted at the shower pressure of 0.3 MPa and the appearance of the outermost boundary wiring portion of the printed circuit board No. 1 evaluated as C when the resist pattern peeling step was conducted at the shower pressure of 0.5 MPa.

A. Peeling of the wiring at the outermost boundary does not occur

B: Falling down of the outermost boundary wiring portion is observed, and it can be determined that peeling of the outermost boundary wiring portion occurs C: The outermost boundary wiring portion is not present at a predetermined location in the conductive pattern, and it can be determined that the peeling state of the outermost boundary wiring portion is worsened <Evaluation Results>

As indicated in Table 1, for the printed circuit boards No. 3 and No. 4 of which the average width of the outermost boundary wiring portion is 30 μm or more, peeling of the outermost boundary wiring portion under all the shower pressure conditions of 0.1 MPa, 0.3 MPa, and 0.5 MPa did not occur.

On the other hand, the printed circuit boards No. 1 and No. 2 of which the average width of the outermost boundary wiring portion is less than 30 μm, peeling of the outermost boundary wiring portion occurred under the shower pressure conditions of 0.3 MPa and 0.5 MPa, and the peeling state of the outermost boundary wiring portion was worsened as the shower pressure increased.

Also, in the printed circuit board No. 5 of which the average aspect ratio of the inner wiring portions is low indicated as a reference example, even if the average width of the outermost boundary wiring is less than 30 μm, peeling of the outermost boundary wiring portion did not occur under all the shower pressure conditions of 0.1 MPa, 0.3 MPa, and 0.5 MPa.

As described above, for a printed circuit board having wiring portions with a high average aspect ratio, when a pressure caused by a shower is applied to the wiring portions, peeling of the wiring portion provided at the boundary between an area without wiring portions and an area where the wiring portions are dense is likely to occur. However, it is understood that even when the printed circuit board is a printed circuit board having wiring portions with a high average aspect ratio, it is possible to suppress peeling of the wiring portion provided at the boundary.

As described above, the printed circuit board in accordance with the embodiment of the present disclosure is suitable as a printed circuit board for small electronic devices because, in a case of having wiring portions with a high average aspect ratio, it is possible to suppress peeling of the wiring portion provided at the boundary between the wiring area in which the wiring portions are formed and the non-wiring area in which the wiring portions are not formed.

DESCRIPTION OF THE REFERENCE NUMERALS

1 base film
2 seed layer
3 metal layer
10, 30 inner wiring portion
11, 31 outermost boundary wiring portion
12, 32 non-wiring area
20, 55 conductive pattern
22, 33 wiring area
50, 100 printed circuit board

The invention claimed is:

1. A printed circuit board comprising:
an insulating base film, and
a plurality of wiring portions formed on a surface of the base film,
wherein the wiring portions include a seed layer that is directly or indirectly layered on the surface of the base film and a metal layer that is layered on the seed layer,
wherein the base film has a wiring area including the plurality of wiring portions and a non-wiring area not including the wiring portions,
wherein the plurality of wiring portions include at least one outermost boundary wiring portion and a plurality of inner wiring portions other than the outermost boundary wiring portion,
wherein the outermost boundary wiring portion is formed on an outermost side of the base film in the wiring area and at a boundary between the wiring area and the non-wiring area,
wherein an average width of the outermost boundary wiring portion is 30 μm or more,
wherein an average width of the inner wiring portions is 20 μm or less, and
wherein an average aspect ratio of the inner wiring portions is 1.5 or more, the average aspect ratio of the inner wiring portions being determined based on a maximum length of a cross section in a thickness direction perpendicular to a longitudinal direction of the inner wiring portions divided by the average width of the inner wiring portions.

2. The printed circuit board according to claim 1, wherein the average width of the outermost boundary wiring portion is 50 μm or more.

3. A method of manufacturing a printed circuit board in which a conductive pattern including a plurality of wiring portions is formed directly or indirectly on a surface of an insulating base film by a semi-additive process, the method comprising:
a seed layer layering step of directly or indirectly layering a conductive seed layer on the surface of the base film;
a resist pattern forming step of forming a resist pattern having an inverted shape of the plurality of wiring portions on a surface of the seed layer,
a metal layer layering step of layering a metal layer by electroplating on the surface of the seed layer exposed from the resist pattern;
a resist pattern peeling step of peeling off the resist pattern, and
a seed layer peeling step of peeling off the seed layer exposed after the resist pattern peeling step,
wherein the base film has a wiring area including the plurality of wiring portions and a non-wiring area not including the wiring portions,
wherein the plurality of wiring portions include at least one outermost boundary wiring portion and a plurality of inner wiring portions other than the outermost boundary wiring portion,
wherein the outermost boundary wiring portion is formed on an outermost side of the base film in the wiring area and at a boundary between the wiring area and the non-wiring area,
wherein an average width of the outermost boundary wiring portion is 30 μm or more,
wherein an average width of the inner wiring portions is 20 μm or less, and
wherein an average aspect ratio of the inner wiring portions is 1.5 or more, the average aspect ratio of the inner wiring portions being determined based on a maximum length of a cross section in a thickness direction perpendicular to a longitudinal direction of the inner wiring portions divided by the average width of the inner wiring portions.

4. The method of manufacturing a printed circuit board according to claim 3, wherein the resist pattern is formed by using a dry film photoresist in the resist pattern forming step of forming the resist pattern.

* * * * *